(12) United States Patent
Shimizu et al.

(10) Patent No.: US 8,092,603 B2
(45) Date of Patent: Jan. 10, 2012

(54) SUBSTRATE PROCESSING APPARATUS

(75) Inventors: Hironobu Shimizu, Toyama (JP);
Nobuo Ishimaru, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 245 days.

(21) Appl. No.: 12/382,403

(22) Filed: Mar. 16, 2009

(65) Prior Publication Data

US 2009/0178619 A1   Jul. 16, 2009

Related U.S. Application Data

(62) Division of application No. 11/878,401, filed on Jul. 24, 2007.

(30) Foreign Application Priority Data

Jul. 26, 2006   (JP) .................................. 2006-203434

(51) Int. Cl.
*C23C 16/00*   (2006.01)
(52) U.S. Cl. ........................................................ 118/725
(58) Field of Classification Search .................. 118/725
See application file for complete search history.

(56) References Cited

U.S. PATENT DOCUMENTS

| | | | |
|---|---|---|---|
| 2,288,035 A | 6/1942 | Somes | |
| 3,403,212 A | 9/1968 | Sato | |
| 3,470,459 A | 9/1969 | Salo | |
| 4,701,821 A * | 10/1987 | Muller | ..................... 360/130.24 |
| 5,850,071 A | 12/1998 | Makiguchi et al. | |
| 6,042,454 A | 3/2000 | Watanabe et al. | |
| 6,972,453 B2 | 12/2005 | Ohtake et al. | |
| 6,996,459 B2 | 2/2006 | Ho et al. | |
| 2004/0149716 A1 | 8/2004 | Inagawa et al. | |
| 2009/0190374 A1* | 7/2009 | Steinbrecher | ................... 363/15 |

FOREIGN PATENT DOCUMENTS

| | | |
|---|---|---|
| JP | A 10-189564 | 7/1998 |
| JP | A 2001-156005 | 6/2001 |
| JP | A 2001-156008 | 6/2001 |
| JP | A 2003-282578 | 10/2003 |

OTHER PUBLICATIONS

Office Action issued in U.S. Appl. No. 12/382,402 on Dec. 14, 2010.
English Translation of JP 10-189564, Sakai, Jul. 1998.
English Translation of JP 2003-282578, Yamaguchi, Oct. 2003.
Election of Species Requirement in U.S. Appl. No. 11/787,401, dated Feb. 18, 2009.
Office Action in U.S. Appl. No. 11/878,401, dated Apr. 28, 2009.
Office Action in U.S. Appl. No. 11/878,401, dated Oct. 5, 2009.
Office Action in U.S. Appl. No. 11/878,401, dated Feb. 9, 2010.
Office Action in U.S. Appl. No. 11/878,401, dated Jun. 10, 2010.
Office Action issued Oct. 28, 2010 in U.S. Appl. No. 11/878,401.

* cited by examiner

*Primary Examiner* — Keath T Chen
(74) *Attorney, Agent, or Firm* — Oliff & Berridge, PLC

(57) ABSTRACT

A substrate processing apparatus includes a processing chamber, a substrate holding part that holds substrates of required numbers in the processing chamber, a gas supply/exhaust part that supplies or exhausts required gas into the processing chamber, a rotation part that rotates the substrate holding part, a first heating part provided in the substrate holding part so as to face at least an upper surface of each substrate held by the substrate holding part, and a power supply part that supplies power to the first heating part in a non-contact state by electromagnetic coupling.

7 Claims, 7 Drawing Sheets

SUBSTRATE PROCESSING APPARATUS

This is a Divisional Application of application Ser. No. 11/878,401 filed Jul. 24, 2007, which claims the benefit of Japanese Patent Application No. 2006-203434 filed Jul. 26, 2006. The entire disclosures of the prior applications are hereby incorporated by reference herein in its entirety.

TECHNICAL FIELD

The present invention relates to a substrate processing apparatus applying processing such as generating a thin film, diffusing impurities, annealing, and etching, to a substrate such as a silicon wafer.

BACKGROUND ART

A batch type substrate processing apparatus for processing substrates of required numbers at once is given as an example of the substrate processing apparatus for processing the substrate such as a silicon wafer and a glass substrate.

The batch type substrate processing apparatus, for example, a vertical substrate processing apparatus has a vertical processing furnace, and the required processing is applied to the substrate in such a manner that the substrate is contained in a processing chamber of this processing furnace, and the processing chamber is exhausted while heating the substrate and introducing processing gas into the processing chamber, in a state that the processing chamber is sealed hermetically.

The substrate to be processed is held in multiple stages in a horizontal posture by a substrate holding means (boat), and inserting and releasing the substrate into/from this processing chamber by the boat is performed through a furnace port at the lower end of the processing furnace.

A processing furnace 1 of a conventional substrate processing apparatus is explained in FIG. 8. Note that FIG. 8 shows a sectional face of the lower end part of this processing furnace 1.

A short tube-like metal manifold 3 is provided at the lower side of a heater base 2, a quartz reaction tube 4 is airtightly erected on an upper end of this manifold 3, and a cylindrical heating apparatus 5 is erected on the heater base 2 concentrically with the aforementioned reaction tube 4. A processing chamber is formed inside the reaction tube 4.

A furnace port 6 is formed at a lower end opening part of the manifold 3, and this furnace port 6 is airtightly sealed by a seal cap 7. This seal cap 7 is attached to an elevating platform 8 which goes up and down by a boat elevator not shown, and a rotating means 9 is airtightly provided in the seal cap 7.

A boat seat 12 is provided at the upper end of a rotation shaft 11 of the rotating means 9, and a boat 13 made of quartz is placed on this boat seat 12.

This boat 13 has a heat insulating part 14 of a lower part and a substrate holding part 15 placed on this heat insulating part 14, and required numbers of heat insulating boards 16 made of quartz or SiC are loaded on the heat insulating part 14.

A wafer 17 to be processed is loaded on this substrate holding part 15 in a horizontal posture at a specified pitch.

When processing is applied to the wafer 17, a specified processing is performed in such a manner that as shown in the figure, the wafer 17 is heated by the heating apparatus 5, with the furnace port 6 airtightly sealed by the seal cap 7, and the processing chamber is exhausted from an exhaust pipe not shown, while introducing the processing gas by a processing gas introducing nozzle 19.

When a uniform film is deposited on the wafer 17, the temperature in the surface of the wafer needs to be constant.

However, heat radiation occurs from the upper end part of the heating apparatus 5 or from the furnace port 6, and particularly, the periphery of the manifold 3 is not surrounded by the heating apparatus 5, and further the manifold 3 is made of metal, thus increasing the heat radiation from the furnace port 6.

Therefore, as described above, the heat insulating part 14 is provided in the boat 13, and the heat insulating board 16 is provided for preventing the heat radiation. Further, in order to prevent the heat radiation from the seal cap, a heater 18 is sometimes provided between the seal cap 7 and the elevating platform 8.

Also, in order to heat the wafer 17 from a peripheral edge, the heating apparatus 5 has a temperature distribution in which the temperature is decreased from the peripheral edge of the wafer to the center thereof.

In a conventional substrate processing apparatus, by providing the heat insulating part 14, the heat radiation from the furnace port 6 is prevented. However, the heat radiation itself can not be prevented, and therefore a dummy wafer is loaded on the lower part of the substrate holding part 15, and the wafer is processed by a uniformly heating member in the processing chamber. In addition, by processing the wafer by the uniformly heating member, uniformity among wafers and uniformity in the wafer surfaces are guaranteed.

However, problems are involved as follows. When the heat radiation from the furnace port 6 is large, a uniform temperature length (shaft length of the uniformly heating member) becomes short, thus reducing processing numbers of the wafer 17, resulting in deteriorating productivity. Moreover, when the temperature distribution occurs, in-surface uniformity of a film thickness is deteriorated, thereby inviting the deterioration of a processing quality and yield.

SUMMARY OF THE INVENTION

In view of the above-described circumstances, the present invention is provided, and an object of the present invention is to prevent heat radiation from a furnace port in a processing furnace, increase a uniform temperature length of a processing chamber and improve uniformity of a temperature distribution in a surface of a substrate, and improve a processing quality and yield.

The present invention relates to a substrate processing apparatus including:

a processing chamber;

a substrate holding part that holds substrates of required numbers in the processing chamber;

a gas supply/exhaust part that supplies or exhausts a required gas into the processing chamber;

a rotation part that rotates the substrate holding part;

a first heating part provided in the substrate holding part so as to face at least an upper surface of each substrate held by the substrate holding part; and a power feeder that supplies power to the first heating part by electromagnetic coupling, in a non-contact state.

According to the present invention, one or more effects given hereunder can be exhibited.

(1) The substrate that rotates together with the substrate holding part in the processing chamber can be heated from an upper surface side.

(2) A temperature difference between a substrate peripheral edge and a substrate center can be suppressed.

(3) Temperature uniformity of the substrate is improved.

(4) Uniformity of a thickness of a film formed on the substrate is improved.
(5) Processing yield is improved.

DESCRIPTION OF PREFERRED EMBODIMENTS OF THE INVENTION

Preferred embodiments for executing the present invention will be explained with reference to the drawings.

Figure 1:
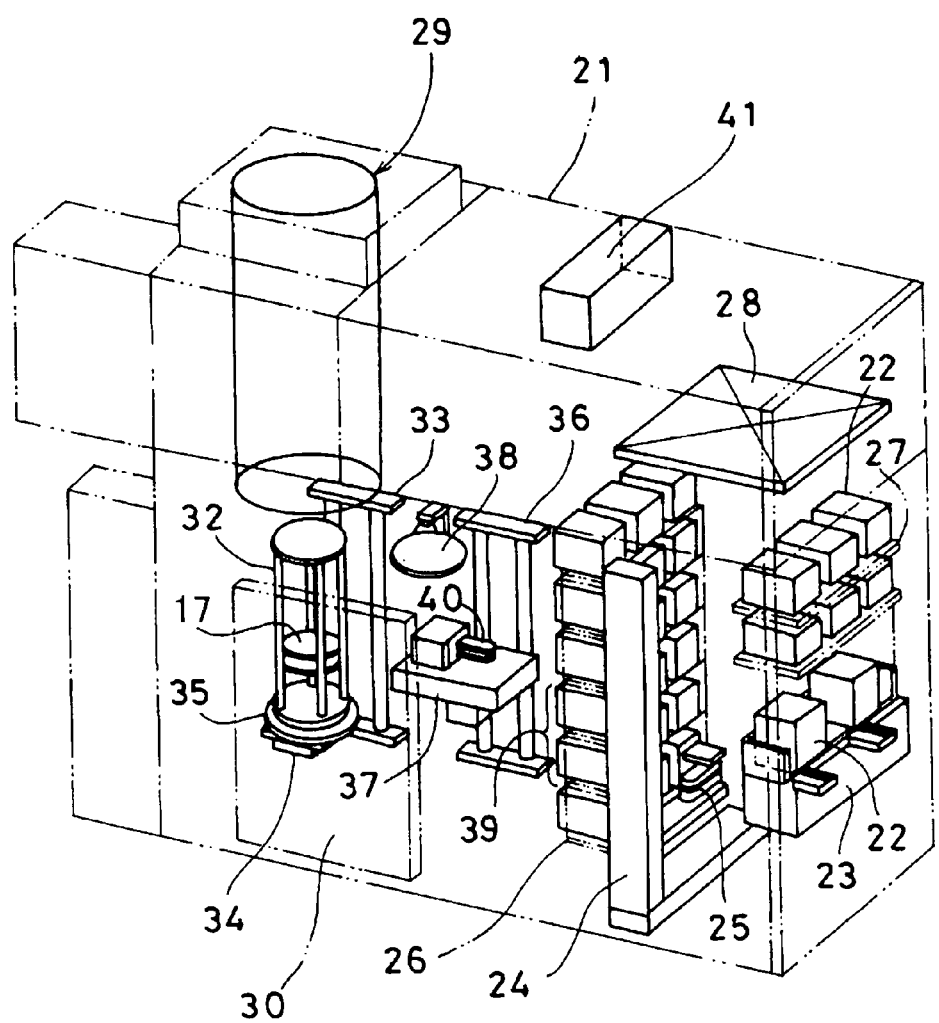
FIG. 1 is an outlined explanatory view of a substrate processing apparatus according to an embodiment of the present invention.

First, an outline of a substrate processing apparatus to which the present invention is applied will be explained by using FIG. 1.

A cassette stage 23 as a container transferring means for transferring a cassette 22 as a substrate storage container between the substrate processing apparatus and an external carrying apparatus not shown is provided at a front side in a case 21, a cassette elevator 24 as an elevating means is provided at a rear side of this cassette stage 23, and a cassette carrying machine 25 as a cassette carrying means is attached to this cassette elevator 24. In addition, a cassette shelf 26 as a storing means of the cassette 22 is provided at the rear side of the cassette elevator 24, and a spare cassette shelf 27 as the cassette storing means is provided in an upper part of the cassette stage 23. A fan and a clean unit 28 constituted of a dust-proof filter are provided in an upper part of this spare cassette shelf 27, so that clean air is circulated into the case 21, for example, into a region where the cassette 22 is carried.

A processing furnace 29 is provided at the rear upper part of the case 21, and a boat elevator 33 as an elevating means for inserting and releasing a boat 32 as a substrate holding means for holding a wafer 17 as a substrate in multiple stages in a horizontal posture into/from the processing furnace 29, is provided in the lower part of this processing furnace 29. A seal cap 35 as a lid for sealing a furnace port of the processing furnace 29 is attached to the tip part of an elevating member 34 attached to this boat elevator 33. The boat 32 is vertically supported by this seal cap 35, and this boat 32 holds the wafer 17 as will be described later in multiple stages in a horizontal posture.

A transferring elevator 36 as an elevating means is provided between the boat elevator 33 and the cassette shelf 26, and a wafer transferring machine 37 as a substrate transferring means is attached to the transferring elevator 36. This wafer transferring machine 37 has substrate carrying plates 40 of required numbers (such as five) on which the substrate is placed, and these substrate carrying plates 40 are rotatably and forward/backward movably formed.

Further, a furnace port shutter 38 as a shielding member having an opening/closing mechanism for shielding a furnace port of the processing furnace 29 is provided in the vicinity of the lower part of the processing furnace 29.

A clean unit 30 constituted of the fan and the dust-proof filter is provided on the side face of the case 21 that faces the transferring elevator 36, and the clean air sent from this clean unit 30 circulates through the region including the wafer transferring machine 37, the boat 32, and the boat elevator 33, and thereafter is exhausted outside of the case 21 by an exhaust device not shown.

A controller 41 performs a driving control of the cassette carrying machine 25, the wafer transferring machine 37, and the boat elevator 33, etc, and a heating control of the processing furnace 29.

An action will be explained hereunder.

The cassette 22, on which the wafer 17 is loaded in a vertical posture, is carried into the cassette stage 23 from the external carrying apparatus not shown, and is rotated at 90° on the cassette stage 23, so that the wafer 17 takes a horizontal posture. Further, the cassette 22 is carried from the cassette stage 23 to the cassette shelf 26 or the spare cassette shelf 27, by a cooperation of an elevating action and a traversing action of the cassette elevator 24, advancing/retreating action and a rotating action of the cassette carrying machine 25.

The cassette shelf 26 has a transferring shelf 39 in which the cassette 22, being a carrying object of the wafer transferring machine 37 is stored, and the cassette 22 provided for transferring of the wafer is transferred to the transferring shelf 39 by the cassette elevator 24 and the cassette carrying machine 25.

When the cassette 22 is transferred to the transferring shelf 39, the wafer transferring machine 37 transfers the wafer 17 to the boat 32 in a descent state from the transferring shelf 39 by the cooperation of the advancement/retreating action and the rotating action of the substrate carrying plates 40 and the elevating action of the transferring elevator 36.

When wafers 17 of required numbers are transferred to the boat 32, the boat 32 is lifted by the boat elevator 33, and this boat 32 is inserted into the processing furnace 29. With the boat 32 completely inserted, the processing furnace 29 is airtightly sealed by the seal cap 35.

In this processing furnace 29 thus airtightly sealed, in accordance with a selected processing recipe, the wafer 17 is heated and the processing gas is supplied into the processing furnace 29. Then, processing is applied to the wafer 17, while exhausting an atmosphere in the processing chamber 46 as will be described later from an exhaust pipe 55 as will be described later by the exhaust devise not shown.

Figure 2:
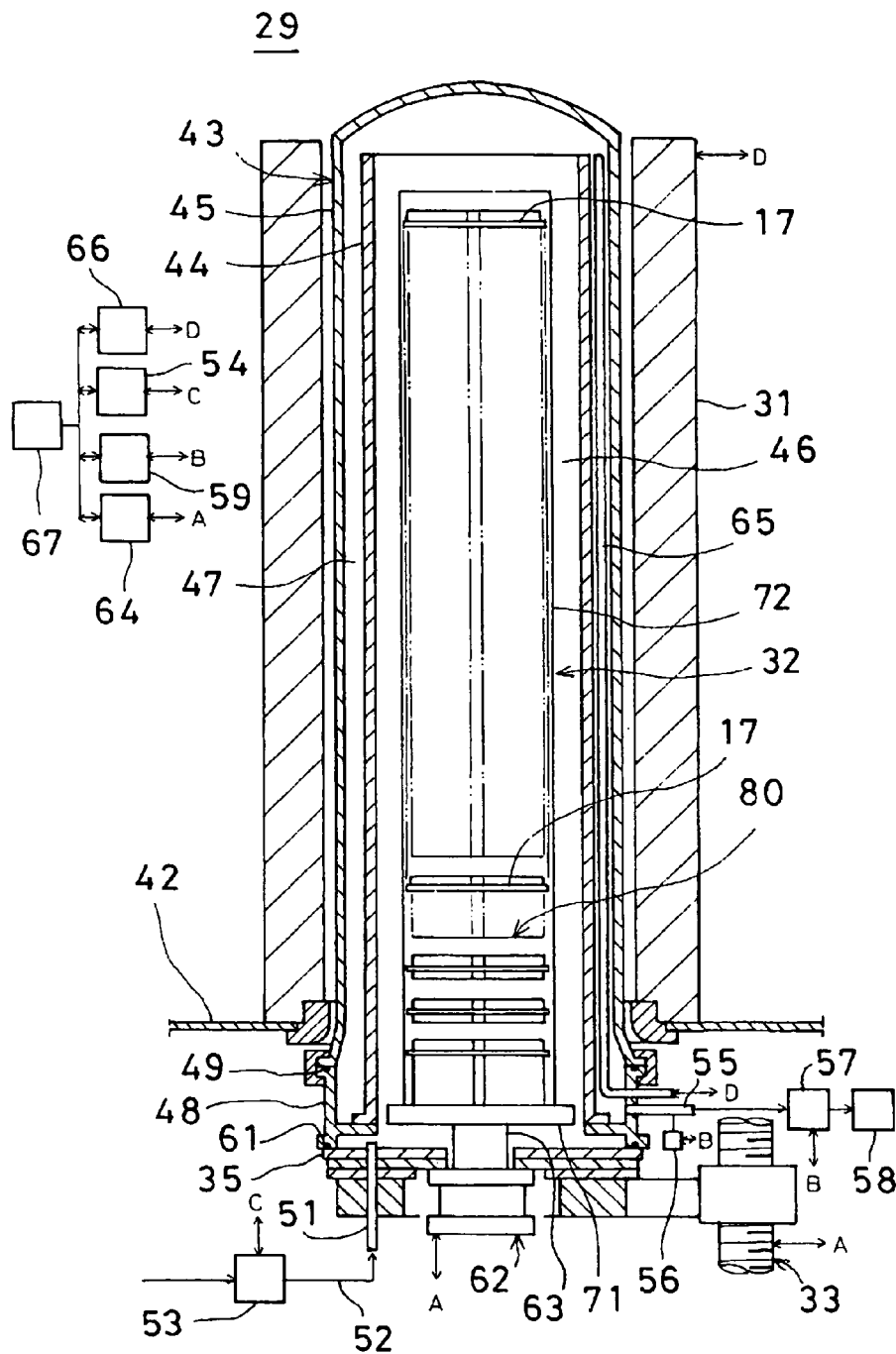
FIG. 2 is a sectional view showing an example of a processing furnace used in this substrate processing apparatus.

An example of the processing furnace 29 used in the above-described substrate processing apparatus will be explained by using FIG. 2.

The processing furnace 29 has a heater 31 as a heating mechanism. This heater 31 is formed in a cylindrical shape, and is supported by a heater base 42 as a holding plate, thereby being set vertically.

A process tube 43 as a reaction tube is disposed concentrically with the heater 31, in the inside of the heater 31. This process tube 43 is constituted of an inner tube 44 as an internal reaction tube and an outer tube 45 as an external reaction tube provided outside the inner tube 44. The inner tube 44 is made of a heat resistance material such as quartz ($SiO_2$) or silicon carbide (SiC), and has a cylindrical shape with upper end and lower end opened. The processing chamber 46 is demarcated in the inside of the inner tube 44, and the boat 32 is inserted into the processing chamber 46.

The outer tube 45 is made of the heat resistance material such as quartz or silicon carbide, and is formed in the cylindrical shape, with inner diameter larger than outer diameter of the inner tube 44, and with the upper end sealed and lower end opened, and is provided concentrically with the inner tube 44. A cylindrical space 47 is formed between the inner tube 44 and the outer tube 45.

A single tube-shaped manifold 48 is disposed in the lower part of the outer tube 45 concentrically with the outer tube 45. This manifold 48 is made of stainless for example, and the inner tube 44 and the outer tube 45 are supported by the manifold 48. In addition, an O-ring 49 as a seal member is provided between the manifold 48 and the outer tube 48. The manifold 48 is supported by the heater base 42 and the process tube 43 is thereby vertically set. A reaction container is formed by this process tube 43 and the manifold 48.

A nozzle 51 as a gas introducing part is penetrated through the seal cap 35 so as to communicate with an interior of the processing chamber 46, and a gas supply pipe 52 is connected to the nozzle 51. A processing gas supply source and an inactive gas supply source not shown are connected to the upstream side of this gas supply pipe 52 through a mass flow controller 53. A gas flow controller 54 is electrically connected to the mass flow controller 53, and a gas flow rate is controlled so as to be a desired quantity at a desired timing.

An exhaust pipe 55 for exhausting the atmosphere in the processing chamber 46 is communicated with the manifold 48. This exhaust pipe 55 is communicated with the lower end part of the cylindrical space 47.

A pressure sensor 56 and a pressure adjusting device 57 as a pressure detector are provided toward the downstream side of the exhaust pipe 55, and the exhaust pipe 55 is connected to a vacuum exhaust device 58 such as a vacuum pump.

A pressure controller 59 is electrically connected to the pressure adjusting device 57 and the pressure sensor 56, and based on a pressure detected by the pressure sensor 56, the pressure controller 59 controls the pressure, so that the pressure in the processing chamber 46 is set to a desired pressure (vacuum) by the pressure adjusting device 57.

The seal cap 35 for opening and closing the furnace port is made of metal such as stainless, and is formed in a circular disc. An O-ring 61 as a seal member that abuts on the lower end of the manifold 48 is provided on the upper surface of this seal cap 35.

A rotation mechanism 62 for rotating the boat 32 is set at the lower side of the seal cap 35. A rotation shaft 63 of this rotation mechanism 62 penetrates through the seal cap 35, and is connected to the boat 32, so as to make the boat 32 rotatable. The seal cap 35 is liftably supported by the boat elevator 33, and the boat 32 can be inserted or released into/from the processing chamber 46 by this boat elevator 33. A drive controller 64 is electrically connected to the rotation mechanism 62 and the boat elevator 33, and controls driving so as to perform a desired action at a desired timing.

The boat 32 is made of the heat resistance material such as quartz or silicon carbide, and is formed so that a plurality of wafers 17 can be held in horizontal postures, with centers aligned with one another in multiple stages.

Next, the boat 32 will be explained with reference to FIG. 3.

At least three boat supports 72 are erected on a boat seat 71, and a heating plate 73 is horizontally provided vertically on the boat supports 72 at a specified interval. The boat seat 71, the boat support 72, and the heating plate 73 are formed in a hollow structure, and interiors of the boat support 72 and the heating plate 73 are communicated with each other.

Figure 4:
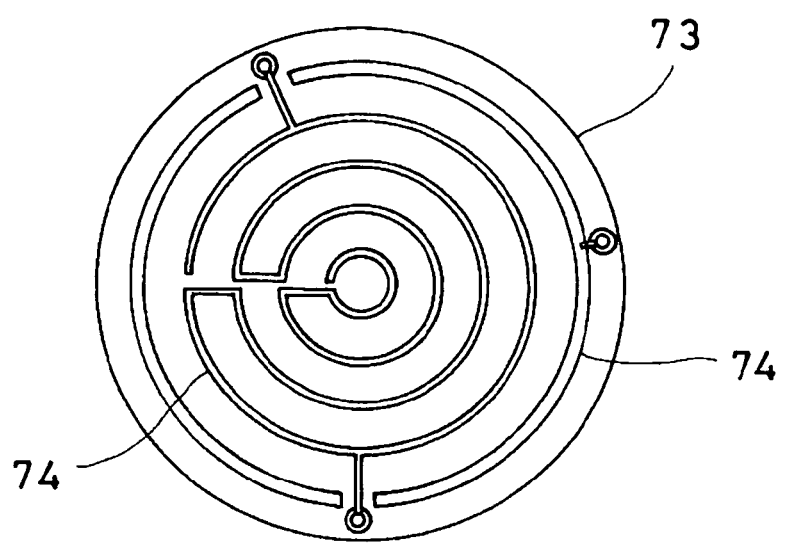
FIG. 4 is a view shown by an arrow taken along A-A of FIG. 3.

Heaters 74 are internally provided in the inside of the heating plate 73. As shown in FIG. 4, the heaters 74 are constituted so that a linear heat generator is disposed in a concentric multiple overlapped circles, thereby making it possible to uniformly heat the wafers by an entire surface of the heating plate 73. The heater 74 of each stage is electrically connected by a lead 75 arranged in the boat support 72, and is connected to a power receiver 76 provided at an undersurface center of the boat seat 71. The heating plate 73 and the heaters 74 constitute a substrate heating means 80.

A substrate receptacle member 77 is protrusively provided below the heating plate 73 of the boat support 72, the wafer 17 is placed on the substrate receptacle member 77, and the wafer 17 is held so as to face each heating plate 73.

The rotation shaft 63 is protrusively provided downward at the undersurface center of the boat seat 71. This rotation shaft 63 has a hollow cylindrical shape, and a connecting coil is internally provided in the inside of the rotation shaft 63 as the power receiver 76.

The rotation shaft 63 is connected to a cylindrical shaped rotor 78 of the rotation mechanism 62, and this rotor 78 is rotatably supported through a bearing 81 and the rotor 78 is rotated by an actuator 82 constituted of a decelerator and a motor.

A power feeder 83 is provided in the center of the rotation shaft 63 in a manner of non-contact with the rotation shaft 63, and this power feeder 83 is disposed so as to face the power receiver 76. The power feeder 83 is composed of an induction coil, for example, and the power feeder 83 is connected to a high frequency power source 84 as a power feeding means.

The power receiver 76 and the power feeder 83 form an induction coupling, which is an electromagnetic coupling, and when a high frequency power is applied to the power feeder 83, a high frequency wave is inducted and excited to the power receiver 76, and the high frequency power is transferred to the power receiver 76. Namely, the heater 74 and the high frequency power source 84 are coupled to each other by the electromagnetic coupling.

Note that the inactive gas is enclosed in the interior of the heating plate 73, the interior of the boat support 72, and the interior of the rotation shaft 63, respectively. It is preferable to set an enclosing pressure at 100 Torr or more and further 760 Torr or more.

Note that when the heaters 74 are internally provided in the heating plate 73, the heaters 74 may be integrally formed with the heating plate 73 so as to be enclosed in the interior thereof. Similarly, the lead 75 may be integrally formed with the boat support 72, and the power receiver 76 may be integrally formed with the rotation shaft 63, so as to be enclosed in the interiors thereof, respectively.

The high frequency power source 84 is electrically connected to a temperature controller 66, and this temperature controller 66 controls the high frequency power source 84 and controls a heating state of the heating plate 73.

Note that a divisional control for independently controlling an upper part, a center, and a lower part of the boat 32 is possible by the heaters 74, and a larger power may be supplied to the upper part and the lower part where the heat radiation is large.

A temperature sensor 65 is set in the process tube 43, and the temperature controller 66 is electrically connected to the temperature sensor 65 and the heater 31. Thus, based on temperature information detected by the temperature sensor 65, a power feeding condition to the heater 31 is adjusted, thereby controlling the temperature of the processing chamber 46 to have a desired temperature distribution at a desired timing.

The gas flow controller 54, the pressure controller 59, the drive controller 64, the temperature controller 66, and an operation part and an input/output part not shown are electrically connected to a main control apparatus 67 for controlling an entire body of the substrate processing apparatus.

Next, by using the processing furnace 29 of the above-described structure, explanation is given to a method of forming a thin film on the wafer 17 by a CVD method, as one step of the manufacturing steps of a semiconductor device. Note that in the explanation given hereunder, an operation of each part constituting the substrate processing apparatus is controlled by the main control apparatus 67.

When a plurality of numbers of wafers 17 are loaded on the boat 32, this boat 32 is inserted into the processing chamber 46 by the boat elevator 33 (boat loading). In this state, the seal cap 35 airtightly seals the furnace port through the O-ring 61.

The processing chamber 46 is evacuated by the vacuum exhaust device 58 so that the interior thereof is set at a desired pressure (vacuum). At this time, the pressure in the processing chamber 46 is measured by the pressure sensor 56, and based on this measured pressure, the pressure adjusting device 57 is feedback-controlled.

In addition, the wafer 17 and the processing chamber 46 are heated by the heater 31 so as to be set at a desired temperature. At this time, the power feeding condition to the heater 31 is feedback-controlled based on the temperature information detected by the temperature sensor 65, so that the interior of the processing chamber 46 has a desired temperature distribution.

Moreover, the power for heating is supplied to the heaters 74 from the high frequency power source 84 through the power feeder 83 and the power receiver 76, and the wafer 17 facing the heating plate 73 is heated through the heating plate 73.

The heating plate 73 has the heaters 74 disposed on an entire surface thereof, to uniformly heat the wafer 17. Note that the wafer 17 is heated from the peripheral edge by the heater 31. Therefore, it may be so structured that the heaters 74 are disposed so that heat generation quantity becomes large at the center, and consequently, heating temperature in the surface of the wafer 17 becomes uniform.

In addition, the heat radiation from the furnace port is suppressed by heating by the heating plate 73 of the lower part of the boat 32, and a temperature drop at the lower part of the boat 32 is prevented. Therefore, the uniform temperature length of the processing furnace 1 is increased, and the temperature uniformity between wafers 17 and the uniformity of the temperature distribution in the surface of the wafer 17 are improved.

Subsequently, the boat 32 is rotated by the rotation mechanism 62, and the wafer 17 is simultaneously rotated. By the rotation of the boat 32, even when the power is being fed to the heaters 74, the boat 32 is rotated without any problem, because the power feeder 83 and the power receiver 76 are in the non-contact state.

Subsequently, the processing gas is supplied from the processing gas supply source, and the processing gas controlled to be a desired flow rate by the mass flow controller 53 is circulated through the gas supply pipe 52 and is introduced into the processing chamber 46 from the nozzle 51. The introduced processing gas drifts upward in the processing chamber 46, turns back at the upper opening of the inner tube 44, then flows down the cylindrical space 47 and is exhausted from the exhaust pipe 55. The processing gas is brought into contact with the surface of the wafer 17 during passing thorough the processing chamber 46, and by a thermal CVD reaction that occurs at this time, the thin film is deposited on the surface of the wafer 17.

When a previously set processing time is elapsed, the inactive gas is supplied from an inactive gas supply source, and an atmosphere of the processing chamber 46 is replaced with the inactive gas and the pressure in the processing chamber 46 is returned to a normal pressure.

Thereafter, the seal cap 35 is descended by the boat elevator 33, the furnace port is opened, and the already processed wafer 17 is pulled out from the processing chamber 46 in a state of being held by the boat 32. Thereafter, the already processed wafer 17 is delivered from the boat 32 by the wafer transferring machine 37.

Note that as an example of processing conditions for processing the wafer in the processing furnace of this embodiment, when a $Si_3N_4$ film is formed, the processing temperature is set at 300 to 600° C., the processing pressure is set at 40 to 933 Pa, type of the gas is determined, and a gas supply flow rate is set at DCS 4 to 6 slm, NH3 0.5 to 1 slm. Then, by setting a certain value in a range of each processing condition and maintaining this value constant, the wafer is processed.

Figure 5:
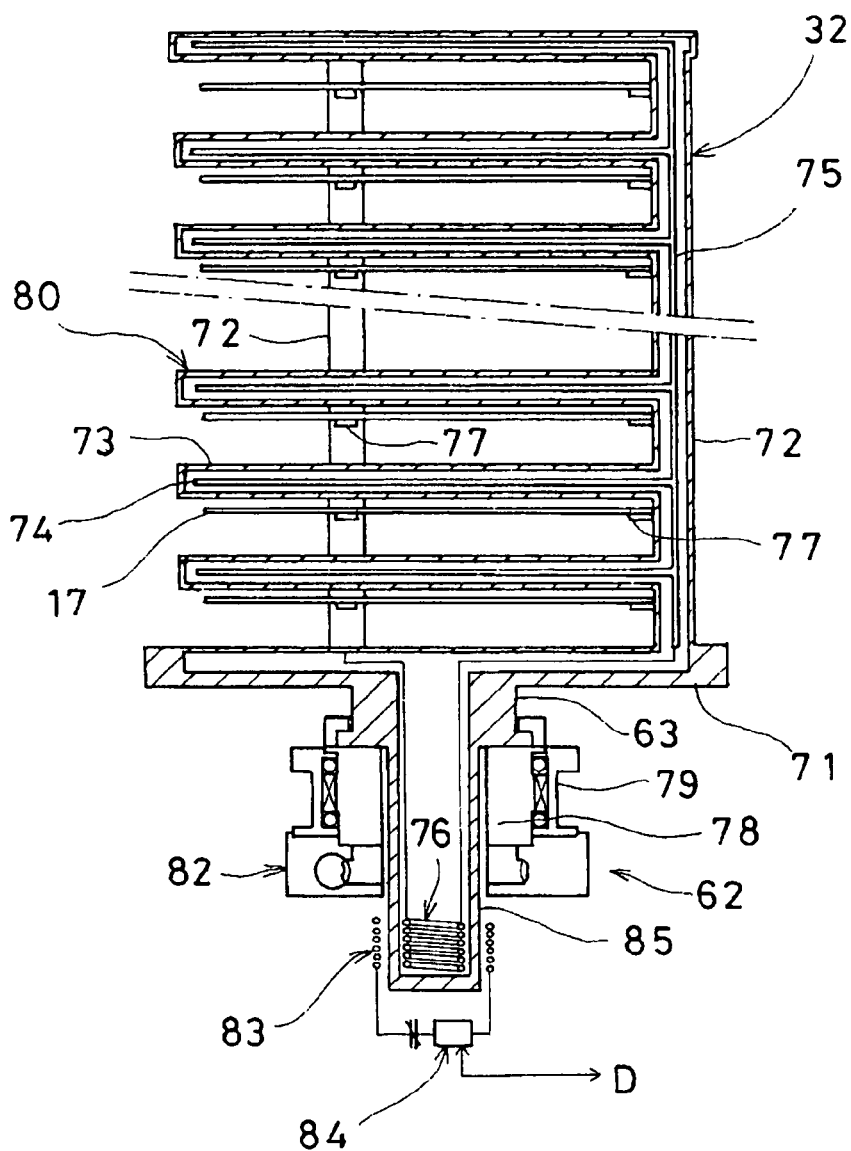
FIG. 5 is a sectional view showing the boat used in a second embodiment of the present invention.

FIG. 5 shows a second embodiment.

Figure 3:
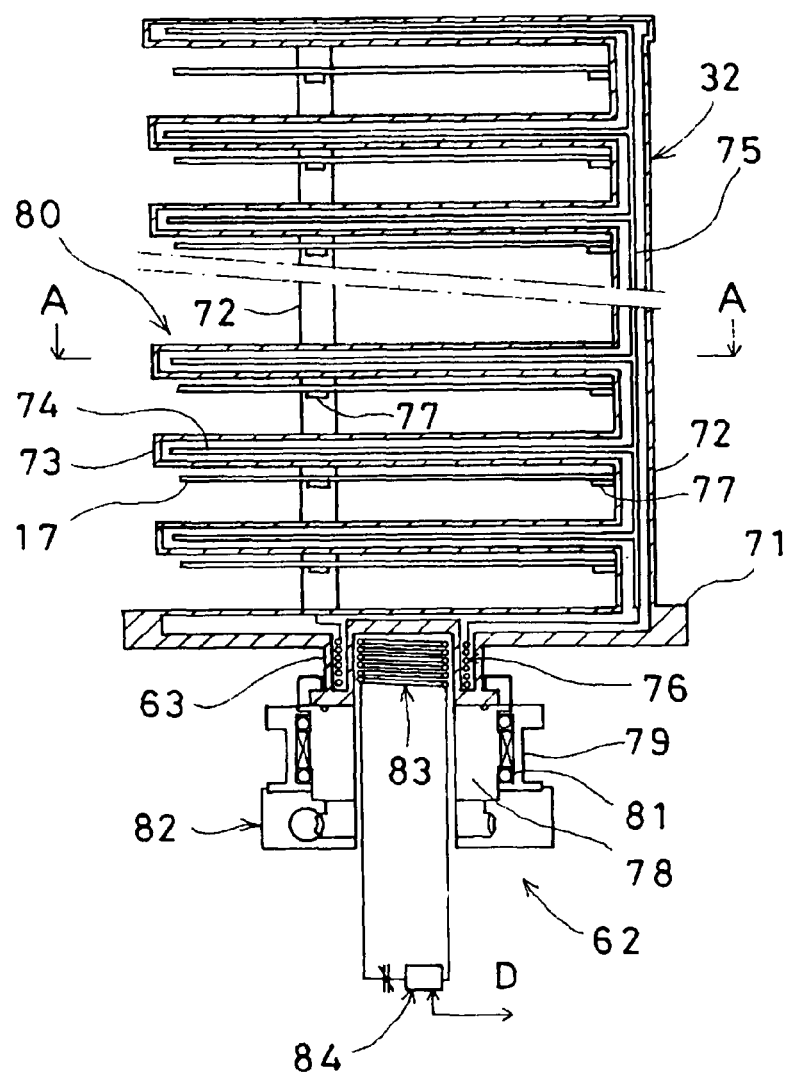
FIG. 3 is a sectional view showing a boat used in a first embodiment of the present invention.

In FIG. 5, the same signs and numerals are assigned to the equivalent part of FIG. 3.

In the second embodiment, a power receiving shaft portion 85 is extended downward from the rotation shaft 63. The lower end part of this power receiving shaft portion 85 is penetrated through a holder 79 and protruded downward. The power receiving shaft portion 85 has a hollow structure and the interior of this power receiving shaft portion 85 is communicated with the hollow part of the boat support 72.

The power receiver 76 is disposed so as to be positioned at the lower end part of the interior of the power receiving shaft portion 85, the power feeder 83 is provided in a non-contact state so as to surround the lower end part of the power receiving shaft portion 85, and the power feeder 83 and the power receiver 76 are faced with each other to realize the induction coupling.

The power feeder 83 is connected to the high frequency power source 84, and when the high frequency power is applied to the power feeder 83 from the high frequency power source 84, the high frequency wave is inducted and excited to the power receiver 76, and the high frequency power is transferred to the power receiver 76 and is further fed to the heaters 74.

In the aforementioned first and second embodiments, when a circular coil, with 60ϕ as a nominal diameter, is used in the power receiver 76 and the power feeder 83, and the interval between coils is set at 5 mm, discharge occurs at 300 W between the power receiver 76 and the power feeder 83 in a nitrogen gas atmosphere of 1 Torr. Note that in order to improve efficiency of power propagation, a resonance capacitor may be added to the connecting coil as the power receiver 76.

Figure 6:
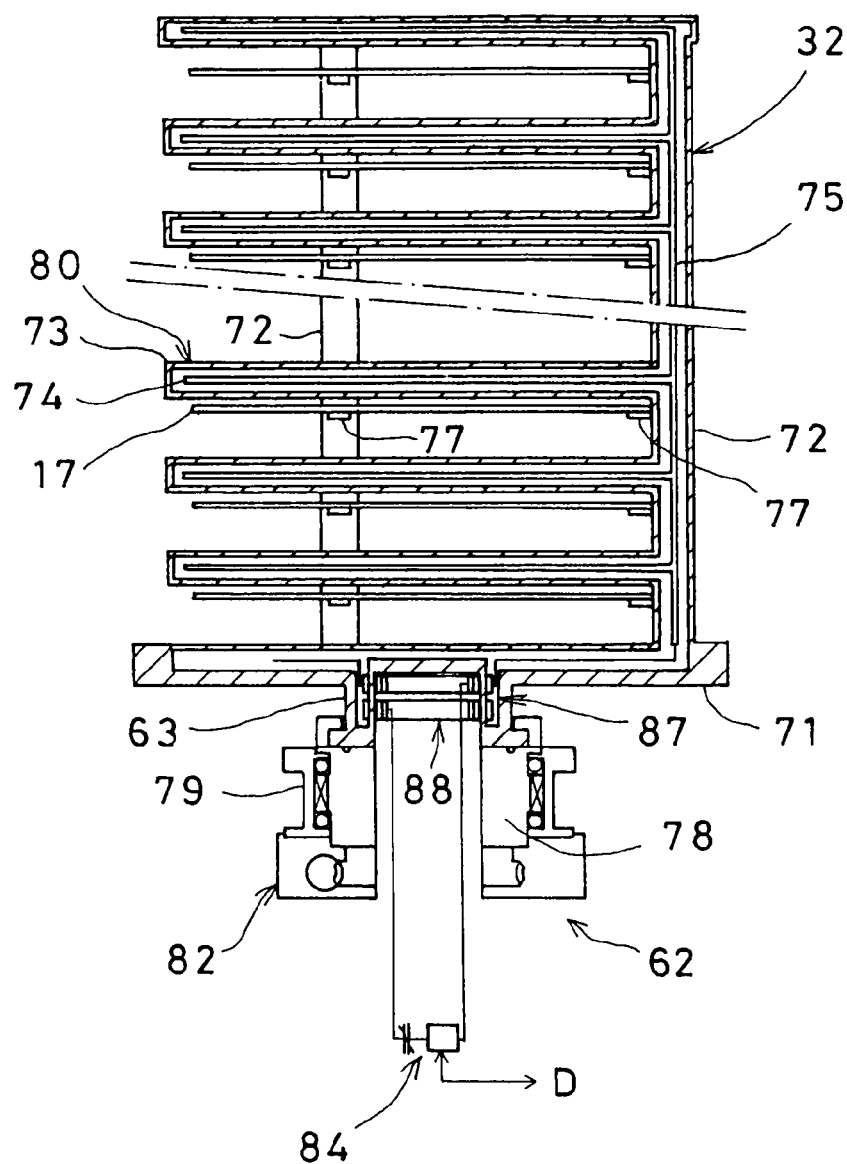
FIG. 6 is a sectional view showing the boat used in a third embodiment of the present invention.
Figure 7:
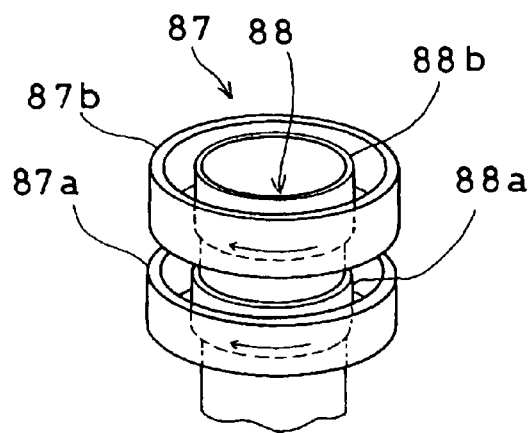
FIG. 7 is an explanatory view of a power feeder and a power receiver in a third embodiment of the present invention.
Figure 8:
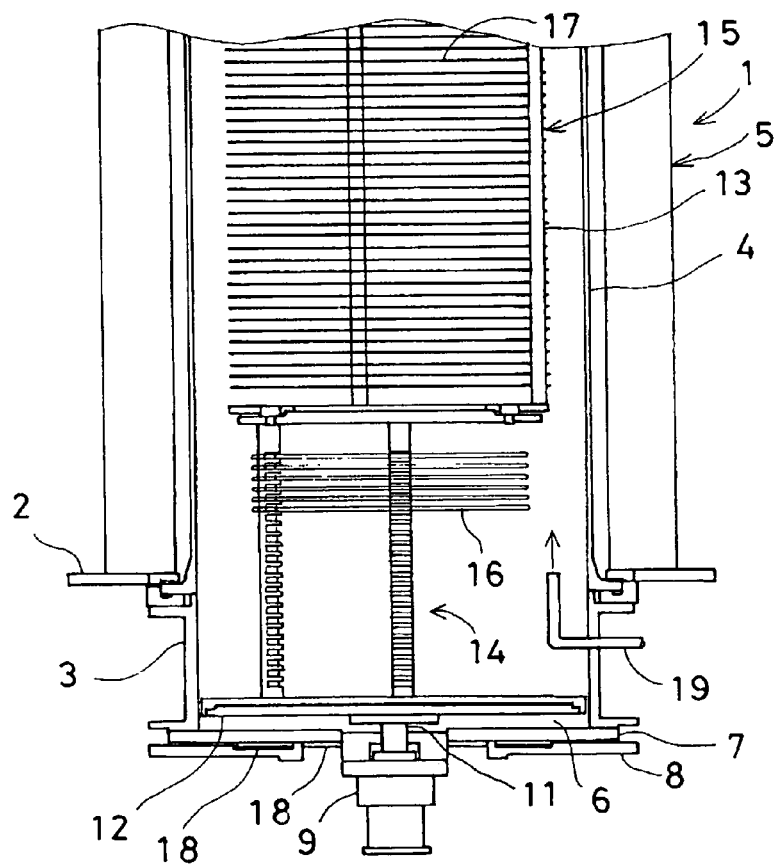
FIG. 8 is a sectional view showing a lower part of the processing furnace of a conventional example.

FIG. 6 and FIG. 7 show a third embodiment.

In FIG. 6, the same signs and numerals are assigned to the equivalent part of FIG. 3, and explanation therefore is omitted.

A cylindrical shaped rotation shaft 63 is protrusively provided downward at the undersurface center of the boat seat 71, a thick part of the rotation shaft 63 is further hollowed, and cylindrical shaped pair of electrostatic plates 87a and 87b are concentrically provided vertically in the inside of the thick part. One of the leads 75 connected to the heater 74 is connected to the electrostatic coupling plate 87a, and the other lead 75 is connected to the electrostatic plate 87b.

Power supply plates 88a and 88b are provided in the center of the rotation shaft 63 concentrically with the electrostatic coupling plates 87a and 87b. The power supply plates 88a and 88b are disposed so as to face the electrostatic coupling plates 87a and 87b, and the power supply plates 88a and 88b are connected to the high frequency power source 84. The power supply plates 88a and 88b are in a manner of non-contact with the rotation shaft 63.

A dielectric is interposed between the electrostatic coupling plates 87a, 87b and the power supply plates 88a, 88b, and the electrostatic coupling plates 87a, 87b and the power supply plates 88a, 88b constitute the electrostatic coupling, being the electromagnetic coupling. In a case of this embodiment, the thick part of the rotation shaft 63 made of quartz functions as the dielectric.

The high frequency power is transferred to the heaters 74 from the high frequency power source 84 through the power supply plate 88 and the electrostatic coupling plate 87, and the power is supplied to the substrate heating means 80.

As a specific example, when an area of the electrostatic coupling plate 87 and the power supply plate is set at 10000 mm$^2$ (100 mm×100 mm) and a material between substrates is selected to be quartz glass, capacity of about 70 PF is obtained, and although depending on the shape of a discharge electrode, a high frequency current can be sufficiently sent.

In this case, in order to prevent discharge from occurring in the inside of the boat (dielectric), namely, in interiors of the rotation shaft 63, the heating plate 73, and the lead 75, the interior of the boat is filled with the inactive gas. It is preferable to set a pressure value of the inactive gas at 100 Torr or more and further at 760 Torr or more.

Note that an insulator sheet made of quartz or the insulator sheet made of SiC may be loaded in the lower part of the boat 32, instead of wafers.

In addition, a boat platform as the insulator, and a boat 32 as the substrate holding part are individually provided, and the substrate heating means 80 may be provided only on the boat platform. In this case, the furnace port can be heated by the substrate heating means 80, thus making it possible to prevent the heat radiation from the furnace port.

As described above, since the heating means is provided in the inside of the rotating boat 32, the heating means is provided so as to face each wafer. Therefore, the temperature uniformity between wafers is improved. Also, temperature difference between a wafer peripheral part and a wafer center part is reduced, thus making it possible to improve the temperature uniformity in the surface of the wafer.

Further, the heat radiation from the furnace port and a ceiling part can be prevented, and the uniform temperature length in the processing furnace 1 is increased, and the processing numbers of the wafers are also increased, thus making it possible to improve productivity.

What is claimed is:

1. A substrate processing apparatus comprising:
   a processing chamber;
   a substrate holding part that holds substrates of required numbers in the processing chamber;
   a gas supply/exhaust part that supplies or exhausts required gas into said processing chamber;
   a rotation shaft having a hollow cylindrical shape, with a thick part thereof further hollowed, that rotates said substrate holding part;
   a first heating part provided in said substrate holding part so as to face at least an upper surface of each substrate held by the substrate holding part;
   a power supply part that supplies power to the first heating part in a non-contact state by electromagnetic coupling,
   wherein said power supply part includes at least two cylindrical shaped power supply plates electrically connected to a high frequency power source and at least two cylindrical shaped electrostatic coupling plates electrically connected to said first heating part, and said power supply plates and said electrostatic coupling plates are provided concentrically with a rotation shaft of said substrate holding part.

2. The substrate processing apparatus according to claim 1, wherein said substrate holding part includes a plurality of supports with an internal hollow structure, and a plurality of heating plates with the internal hollow structure supported by said supports, said each heating part is provided in the inside of said heating plate, and power from said power supply part is supplied to said each heating plate by a lead line arranged to pass through an interior of said hollow structure.

3. The substrate processing apparatus according to claim 2, wherein inactive gas is enclosed in the interior of said hollow structure, so that its internal pressure is set at 100 Torr or more.

4. The substrate processing apparatus according to claim 1, wherein a cylindrical shaped second heating part is further provided at the outside of said reaction chamber.

5. The substrate processing apparatus according to claim 4, further comprising a controller, wherein said controller controls said first heating part so that heat generation quantity to a center of each facing substrate can be larger than the heat generation quantity to a peripheral part of a substrate.

6. The substrate processing apparatus according to claim 1, wherein a cylindrical shaped second heating part is further provided at the outside of said reaction chamber.

7. The substrate processing apparatus according to claim 6, further comprising a controller, wherein said controller controls said first heating part so that heat generation quantity to a center of each facing substrate can be larger than the heat generation quantity to a peripheral part of a substrate.

* * * * *